(12) United States Patent
Xu et al.

(10) Patent No.: US 9,130,509 B2
(45) Date of Patent: Sep. 8, 2015

(54) SPS RECEIVER WITH ADJUSTABLE LINEARITY

(71) Applicant: QUALCOMM Incorporated, San Diego, CA (US)

(72) Inventors: Yang Xu, Chicago, IL (US); Timothy Paul Pals, San Diego, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 42 days.

(21) Appl. No.: 14/105,130

(22) Filed: Dec. 12, 2013

(65) Prior Publication Data

US 2014/0097905 A1 Apr. 10, 2014

Related U.S. Application Data

(62) Division of application No. 11/753,542, filed on May 24, 2007, now Pat. No. 8,812,052.

(60) Provisional application No. 60/891,873, filed on Feb. 27, 2007.

(51) Int. Cl.
*H03F 3/04* (2006.01)
*G01S 19/21* (2010.01)
*H03F 1/22* (2006.01)
*H03F 1/32* (2006.01)
*H04B 7/185* (2006.01)
*G01S 19/34* (2010.01)
(Continued)

(52) U.S. Cl.
CPC . *H03F 3/04* (2013.01); *G01S 19/21* (2013.01); *H03F 1/223* (2013.01); *H03F 1/3205* (2013.01); *H04B 7/18513* (2013.01); *G01S 19/34* (2013.01); *G01S 19/36* (2013.01); *H04B 2001/045* (2013.01)

(58) Field of Classification Search
CPC .................................. H03F 3/04; H03F 1/086
USPC .......................................... 330/296, 285, 288
See application file for complete search history.

(56) References Cited

U.S. PATENT DOCUMENTS

| 4,944,025 A | 7/1990 | Gehring et al. |
| 5,548,533 A | 8/1996 | Gao et al. |
| 5,627,857 A | 5/1997 | Wilson |

(Continued)

FOREIGN PATENT DOCUMENTS

| EP | 1453216 | 9/2004 |
| GB | 2339093 | 3/2003 |

(Continued)

OTHER PUBLICATIONS

Taiwan Search Report—TW101133197—TIPO—Feb. 21, 2014.

(Continued)

*Primary Examiner* — Henry Choe
(74) *Attorney, Agent, or Firm* — Arnold J. Gum

(57) ABSTRACT

A device includes a low noise amplifier (LNA) for amplifying an input signal, with the LNA including a first transistor configured to receive the input signal, a second transistor configured to receive a bias current and forming a current mirror for the first transistor, and an operational amplifier (op amp) operative to generate a bias voltage for the first and second transistors to match operating points of the first and second transistors.

10 Claims, 8 Drawing Sheets

(51) Int. Cl.
*G01S 19/36* (2010.01)
*H04B 1/04* (2006.01)

(56) References Cited

U.S. PATENT DOCUMENTS

| | | | |
|---|---|---|---|
| 6,088,348 A | 7/2000 | Bell, III et al. | |
| 6,194,967 B1 | 2/2001 | Johnson et al. | |
| 6,392,492 B1 | 5/2002 | Yuan | |
| 6,417,737 B1 | 7/2002 | Moloudi et al. | |
| 6,442,375 B1 | 8/2002 | Parmentier | |
| 6,442,380 B1 | 8/2002 | Mohindra | |
| 6,498,926 B1 | 12/2002 | Ciccarelli et al. | |
| 6,529,164 B1 | 3/2003 | Carter | |
| 6,577,855 B1 | 6/2003 | Moore et al. | |
| 6,587,000 B2* | 7/2003 | Oikawa | 330/288 |
| 6,694,131 B1 | 2/2004 | Lakkis | |
| 6,738,605 B1 | 5/2004 | Gilberton et al. | |
| 6,765,448 B2* | 7/2004 | Wu et al. | 331/117 FE |
| 6,978,125 B2 | 12/2005 | Lindell et al. | |
| 7,010,270 B1 | 3/2006 | Thomas et al. | |
| 7,113,044 B2* | 9/2006 | Wang | 330/288 |
| 7,116,958 B1 | 10/2006 | Brown et al. | |
| 7,194,050 B2 | 3/2007 | Nicholls et al. | |
| 7,283,851 B2 | 10/2007 | Persico et al. | |
| 7,312,651 B2* | 12/2007 | Kudo | 327/540 |
| 7,323,945 B2 | 1/2008 | Cyr et al. | |
| 7,420,419 B2* | 9/2008 | Hori | 330/288 |
| 7,453,396 B2 | 11/2008 | Levin et al. | |
| 7,529,322 B2 | 5/2009 | Mak et al. | |
| 7,535,413 B2 | 5/2009 | Leinonen et al. | |
| 7,580,692 B2 | 8/2009 | Kravets | |
| 7,835,718 B2 | 11/2010 | Oba et al. | |
| 7,890,076 B2* | 2/2011 | Mattisson et al. | 455/323 |
| 7,949,319 B2 | 5/2011 | Tuttle et al. | |
| 2002/0135424 A1* | 9/2002 | Oikawa | 330/288 |
| 2003/0027534 A1 | 2/2003 | Swazey | |
| 2003/0216128 A1 | 11/2003 | Zhou | |
| 2004/0061646 A1 | 4/2004 | Andrews et al. | |
| 2004/0218576 A1 | 11/2004 | Imagawa et al. | |
| 2005/0134336 A1 | 6/2005 | Goldblatt et al. | |
| 2005/0143040 A1 | 6/2005 | Kerth et al. | |
| 2006/0003722 A1 | 1/2006 | Tuttle et al. | |
| 2006/0009177 A1 | 1/2006 | Persico et al. | |
| 2006/0030266 A1 | 2/2006 | Desai et al. | |
| 2006/0116085 A1 | 6/2006 | Borremans et al. | |
| 2006/0189286 A1 | 8/2006 | Kyu et al. | |
| 2006/0276159 A1 | 12/2006 | Roufoogaran | |
| 2007/0033618 A1 | 2/2007 | Kiukkonen et al. | |
| 2007/0076813 A1 | 4/2007 | Haartsen et al. | |
| 2008/0261548 A1 | 10/2008 | Krone | |
| 2009/0203338 A1 | 8/2009 | Darabi | |
| 2009/0239489 A1 | 9/2009 | Kaczman et al. | |
| 2010/0130156 A1 | 5/2010 | Jin et al. | |
| 2010/0205639 A1 | 8/2010 | Vavelidis et al. | |
| 2010/0285769 A1 | 11/2010 | Conroy et al. | |
| 2011/0037518 A1 | 2/2011 | Lee et al. | |
| 2011/0270418 A1 | 11/2011 | Law et al. | |
| 2011/0300914 A1 | 12/2011 | Gudem et al. | |
| 2012/0231729 A1 | 9/2012 | Xu et al. | |
| 2014/0099885 A1 | 4/2014 | Xu et al. | |

FOREIGN PATENT DOCUMENTS

| | | |
|---|---|---|
| JP | 8321789 A | 12/1996 |
| JP | 2005192018 A | 7/2005 |
| JP | 2006020035 A | 1/2006 |
| JP | 2006121160 A | 5/2006 |
| JP | 2006311353 A | 11/2006 |
| KR | 102001003138 | 11/2006 |
| WO | WO-0011795 | 3/2000 |
| WO | WO-0243259 A2 | 5/2002 |
| WO | WO-2005106523 A1 | 11/2005 |
| WO | WO-2009056150 A1 | 5/2009 |

OTHER PUBLICATIONS

Aparin, et al.: "A fully-integrated highly linear zero-IF CMOS cellular CDMA receiver," IEEE International Solid-State Circuits Conference 2005, Digest of Technical Papers, pp. 324-601 vol. 1, Feb. 10, 2005.
Aparin et al: "Modified derivative superposition method for linearizing FET low noise amplifiers" Radio Frequency Integrated Circuits (RFOC) Symposium, 2004. Digest of Papers. 2004, Piscataway, NJ, USA, IEEE, Jun. 6, 2004, pp. 105-108, XP010714259.
European Search Report—EP11008996—Search Authority—The Hague—Jan. 20, 2012.
International Search Report—PCT/US2008/054461, International Searching Authority—European Patent Office—Sep. 17, 2008.
Karanicolas, A.N.: "A 2.7-V 900-MHz CMOS LNA and Mixer," IEEE Journal of Solid-State Circuits, vol. 31, Issue 12, pp. 1939-1944, Dec. 1996.
Lee, T.: "The Design of CMOS Radio-Frequency Integrated Circuits," Cambridge University Press, , ISBN: 0521835399, First Edition 1998.
Partial International Search Report—PCT/US2008/054461, International Searching Authority—European Patent Office, Jul. 17, 2008.
Shaeffer, et al.: "A 1.5-V, 1.5-GHz CMOS Low Noise Amplifier," IEEE Journal of Solid-State Circuits, vol. 32, Issue 5, pp. 745-759, May 1997.
Taiwan Search Report—TW097106886—TIPO—Mar. 23, 2012.
Taiwan Search Report—TW101108982—TIPO—Nov. 21, 2013.
Written Opinion—PCT/US2008/054461, International Searching Authority—European Patent Office—Sep. 17, 2008.
Xu L. et al., "A Low-IF CMOS Simultaneous GPS Receiver Integrated i n a Multimode Transceiver", Custom Integrated Circuits Conference, IEEE, 2007, pp. 107-110, XP031223552.

* cited by examiner

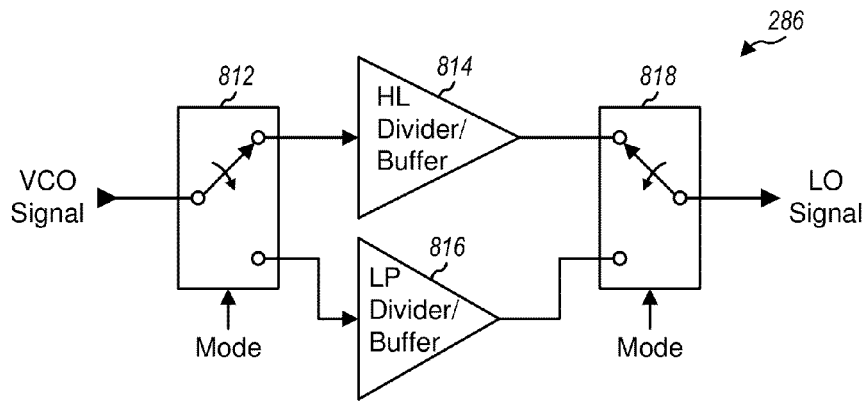
FIG. 8
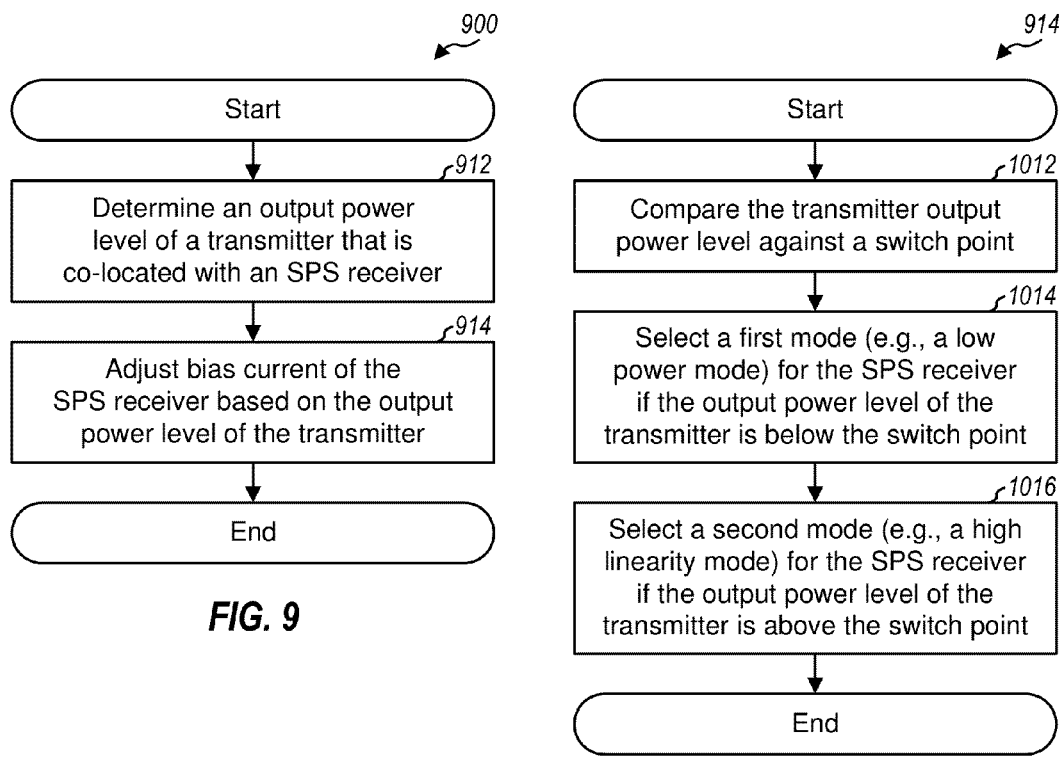
FIG. 9
FIG. 10

SPS RECEIVER WITH ADJUSTABLE LINEARITY

CROSS REFERENCE TO RELATED APPLICATIONS

The present Application for patent is a divisional application of, and claims priority to, U.S. application Ser. No. 11/753,542, entitled "SPS RECEIVER WITH ADJUSTABLE LINEARITY," filed May 24, 2007, which claims the benefit of U.S. Provisional Application No. 60/891,873, entitled "A DYNAMIC LINEARITY ADJUSTABLE GPS RF FRONT-END CIRCUIT BASED ON INTEGRATED TRANSMITTER POWER," filed Feb. 27, 2007, each of which are assigned to the assignee hereof, and expressly incorporated herein by reference.

BACKGROUND

I. Field

The present disclosure relates generally to electronics circuits, and more specifically to a receiver.

II. Background

A receiver is an electronics unit that receives and conditions a radio frequency (RF) input signal. A receiver may perform various types of signal conditioning such as low noise amplification, filtering, frequency downconversion, etc.

The design of a receiver is challenging due to various design considerations such as performance, power consumption, etc. For many applications, high performance is required in order to meet system specifications and/or to achieve good overall performance. The performance of a receiver may be characterized by various parameters such as linearity, dynamic range, and noise performance. Linearity refers to the ability to amplify a signal without generating a large amount of distortion. Dynamic range refers to the range of received signal levels that the receiver is expected to handle. Noise performance refers to the amount of noise generated by the receiver. For certain applications, low power consumption is also highly desirable. For example, a receiver may be used in a portable device such as a cellular phone, and low power consumption may extend battery life between recharges, which is highly desirable.

There is therefore a need in the art for a receiver that can provide good performance with low power consumption.

SUMMARY

A receiver that can provide good performance with low power consumption is described herein. The receiver may be a satellite positioning system (SPS) receiver used to condition signals received from satellites. The SPS receiver may be co-located with a transmitter, which may be transmitting at the same time that the SPS receiver is operating. Large output power from the transmitter may degrade the performance of the SPS receiver.

The SPS receiver may be operated in one of a plurality of modes, which may be associated with different bias current settings for the SPS receiver. One of the modes may be selected based on an output power level of the transmitter. The SPS receiver may include at least one circuit block with adjustable bias current, e.g., a low noise amplifier (LNA), a mixer, a local oscillator (LO) generator, etc. The bias current of each circuit block may be set in accordance with the selected mode.

In one design, a first mode (e.g., a lower power mode) may be selected for the SPS receiver if the transmitter output power level is below a switch point. A second mode (e.g., a high linearity mode) may be selected for the SPS receiver if the transmitter output power level is above the switch point. The second mode is associated with more bias current for the SPS receiver than the first mode. Hysteresis may be used for the transitions between the first and second modes.

Various aspects and features of the disclosure are described in further detail below.

BRIEF DESCRIPTION OF THE DRAWINGS

FIG. 8 shows a schematic diagram of an LO generator for the SPS receiver.

FIG. 9 shows a process for operating the SPS receiver.

FIG. 10 shows a process for selecting a mode for the SPS receiver.

DETAILED DESCRIPTION

Figure 1:
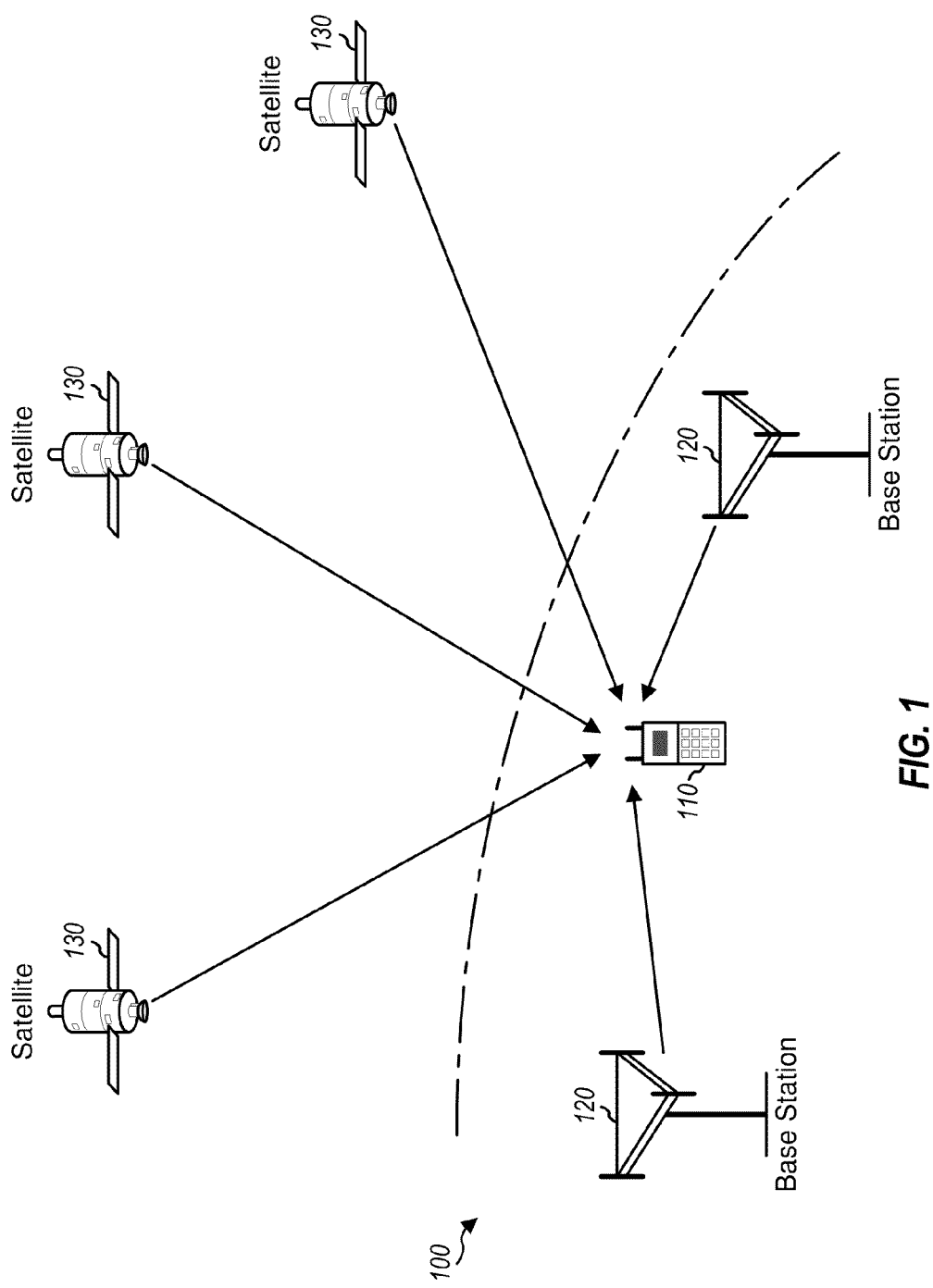
FIG. 1 shows a wireless device transmitting and receiving signals.

FIG. 1 shows a wireless device 110 capable of communicating with a wireless communication system 100. Wireless device 110 may also be referred to as a mobile station, a user equipment (UE), a terminal, an access terminal, a subscriber unit, a station, etc. Wireless device 110 may be a cellular phone, a personal digital assistant (PDA), a handheld device, a wireless modem, a laptop computer, a cordless phone, etc. Wireless device 110 may communicate with one or more base stations 120 in system 100 at any given moment. A base station is a fixed station and may also be referred to as a Node B, an access point, etc.

In general, wireless device 110 may be able to communicate with any number of wireless communication systems and networks. The terms "networks" and "systems" are often used interchangeably. For example, wireless device 110 may be able to communicate with a Code Division Multiple Access (CDMA) system, a Time Division Multiple Access (TDMA) system, a Frequency Division Multiple Access (FDMA) system, an Orthogonal FDMA (OFDMA) system, a Single-Carrier FDMA (SC-FDMA) system, etc. A CDMA system may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. IS-2000 Releases 0 and A are commonly referred to as CDMA2000 1X, or simply, 1X. A TDMA system may implement a radio technology such as Global System for Mobile Communications (GSM). An OFDMA system may implement a radio technology such as Evolved UTRA (E-UTRA), IEEE 802.16, IEEE 802.20, Flash-OFDM®, etc. UTRA, E-UTRA, and GSM are described in documents from an organization named "3rd Generation Partnership Project" (3GPP). cdma2000 is described in documents from an organization named "3rd Generation Partnership Project 2" (3GPP2). These various radio technologies and standards are known in the art. Wireless device 110 may also be able to communicate with a wireless local area network (WLAN), a wireless personal area network (WPAN), etc.

Wireless device 110 is also capable of receiving signals from satellites 130. Satellites 130 may belong to a satellite positioning system (SPS) such as the United States Global Positioning System (GPS), the European Galileo system, the Russian Glonass system, etc. GPS is a constellation of 24 well-spaced satellites that orbit the earth. Each GPS satellite transmits a GPS signal encoded with information that allows GPS receivers on earth to measure the time of arrival of the received GPS signal relative to an arbitrary point in time. This relative time-of-arrival measurement may be converted to a pseudo-range. The position of wireless device 110 may be accurately estimated based on pseudo-range measurements for a sufficient number of satellites and their known locations.

Figure 2:
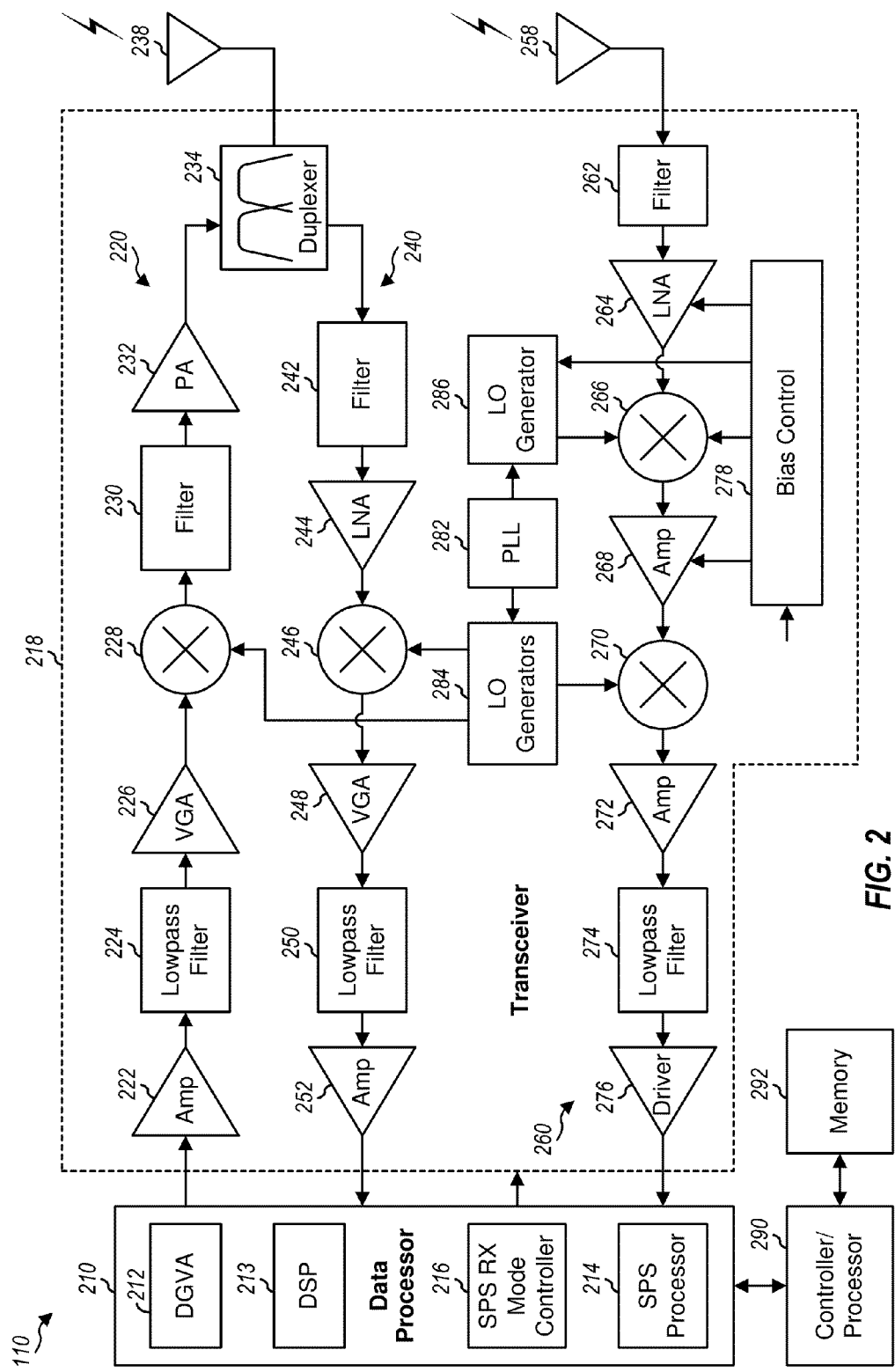
FIG. 2 shows a block diagram of the wireless device.

FIG. 2 shows a block diagram of a design of wireless device 110. In this design, wireless device 110 includes a transceiver 218 with one transmitter 220 and two receivers 240 and 260. Transmitter 220 and receiver 240 may be used for communication with system 100. Receiver 260 may be used to receive signals from satellites 130 and may also be referred to as an SPS receiver. In general, wireless device 110 may include any number of transmitters and any number of receivers for any number of communication systems and frequency bands. In the design shown in FIG. 2, transmitter 220 and receiver 240 are coupled to an antenna 238, and receiver 260 is coupled to another antenna 258. In general, the transmitters and receivers may be coupled to any number of antennas, e.g., transmitter 220 and receivers 240 and 260 may be coupled to a single antenna.

A transmitter or a receiver may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as zero-IF architecture, a signal is frequency converted between RF and baseband in one stage. The super-heterodyne and direct-conversion architectures may use different circuit blocks and/or have different requirements. In the design shown in FIG. 2, transmitter 220 and receiver 240 are implemented with the direct-conversion architecture, and receiver 260 is implemented with the super-heterodyne architecture.

For data transmission, a data processor 210 processes data to be transmitted and provides an analog output signal to transmitter 220 in transceiver 218. Within transmitter 220, the analog output signal is amplified by an amplifier (Amp) 222, filtered by a lowpass filter 224 to remove images caused by digital-to-analog conversion, amplified by a variable gain amplifier (VGA) 226, and upconverted from baseband to RF by a mixer 228. The upconverted signal is filtered by a bandpass filter 230 to remove images caused by the frequency upconversion, further amplified by a power amplifier (PA) 232, routed through a duplexer 234, and transmitted from antenna 238.

For data reception, antenna 238 receives downlink signals from base stations and provides a first received RF signal, which is routed through duplexer 234 and provided to receiver 240. Within receiver 240, the first received RF signal is filtered by a bandpass filter 242, amplified by an LNA 244, and downconverted from RF to baseband by a mixer 246. The downconverted signal is amplified by a VGA 248, filtered by a lowpass filter 250, and amplified by an amplifier 252 to obtain a first analog input signal, which is provided to data processor 210.

For SPS, antenna 258 receives SPS signals from satellites 130 and provides a second received RF signal to SPS receiver 260. Within SPS receiver 260, the second received RF signal is filtered by a bandpass filter 262, amplified by an LNA 264, and downconverted from RF to IF by a mixer 266. The IF signal is amplified by an amplifier 268 and downconverted from IF to baseband by a mixer 270. The downconverted signal is amplified by an amplifier 272, filtered by a lowpass filter 274, and buffered by a driver 276 to obtain a second analog input signal, which is provided to data processor 210. Although not shown in FIG. 2, an IF filter may be placed between mixers 266 and 270 and used to filter the downconverted signal.

A phase locked loop (PLL) 282 generates carrier signals at desired frequencies. LO generators 284 receive one or more carrier signals from PLL 282 and generate LO signals used for frequency upconversion by mixer 228 and frequency downconversion by mixers 246 and 270. An LO generator 286 receives a carrier signal from PLL 282 and generates an LO signal used for frequency downconversion by mixer 266. A bias control unit 278 receives information for transmitter 220 and/or SPS receiver 260 and generates bias controls for circuit blocks such as LNA 264, mixer 266, amplifier 268, LO generator 286, etc. Unit 278 may provide bias currents to these circuit blocks or may provide control signals used to set the bias currents of these circuit blocks. Unit 278 may comprise register, logic, and/or other circuitry.

Data processor 210 may include various processing units for data transmission and reception via system 100 and also for SPS processing. For example, data processor 210 may include a digital VGA (DVGA) 212 that provides a selectable gain for data being sent via transmitter 220. Data processor 210 may include a digital signal processor (DSP) 213 that performs various functions for data transmission and reception and other operations. Data processor 210 may also include an SPS processor 214 that performs processing for received SPS signals and an SPS receiver (RX) mode controller 216 that selects an operating mode for SPS receiver 260. Data processor 210 may be an application specific integrated circuit (ASIC) such as a mobile station modem (MSM). A controller/processor 290 may direct the operations of various processing units in wireless device 110. A memory 292 may store data and program codes for wireless device 110.

FIG. 2 shows an example transceiver design. In general, the conditioning of the signals in the transmitter and receivers may be performed by one or more stages of amplifier, filter, mixer, etc. These circuit blocks may be arranged differently from the configuration shown in FIG. 2. Furthermore, other circuit blocks not shown in FIG. 2 may also be used to condition the signals in the transmitter and receivers.

FIG. 2 also shows an example SPS receiver design. In general, an SPS receiver may implement the super-heterodyne architecture (as shown in FIG. 2) or the direct-conversion architecture (not shown in FIG. 2). The SPS receiver design in FIG. 2 may provide certain advantages such as (1) simply LO generator for mixer 270 and (2) separate PLLs for transmitter 220, receiver 240, and SPS receiver 260. For example, the LO generator for mixer 270 may be implemented with a divider that divides a reference clock from a reference oscillator (e.g., a TCXO) by an integer ratio. SPS receiver 260 may operate at the same time that transmitter 220 is active. For example, transmitter 220 may be used for W-CDMA or cdma2000 and may be active for an entire call.

Transmitter 220 may also be used for GSM and may be active during the same time that SPS receiver 260 is active. In any case, when transmitter 220 and SPS receiver 260 are simultaneously active, large output power from transmitter 220 may degrade the performance of SPS receiver 260. For example, a CDMA signal from transmitter 220 on an Advanced Wireless Services (AWS) band and an external CDMA or GSM signal on a Personal Communications Service (PCS) band may create large third-order inter-modulation distortion (IM3), which may fall within an SPS band and may be hard to distinguish from the received SPS signals. The magnitude of the IM3 may be dependent on the linearity of SPS receiver 260. Hence, linearity requirements of SPS receiver 260 may be more stringent due to high output power from transmitter 220. Large transmitter power leaking to the SPS receiver input may also cause other nonlinearity such as second-order inter-modulation (IM2) and gain compression, which may significantly degrade the performance of the SPS receiver.

Various circuit blocks in SPS receiver 260 (e.g., LNA 264, mixer 266, and amplifier 268) may be biased with large amounts of current in order to meet the worst-case linearity requirements imposed by the maximum output power from transmitter 220 and/or to reduce noise from LO generator 286. More bias current may be used to (i) prevent gain compression from increasing the noise figure of SPS receiver 260, (ii) lower the noise floor of LO generator 286, since the jammer may reciprocally mix the LO noise into the SPS band, and (iii) improve linearity in order to reduce IM2 and IM3 that may fall in-band. Operating SPS receiver 260 with large amounts of bias current may ensure good performance even with high transmitter output power. However, operating SPS receiver 260 with large amounts of bias current all the time may result in excessive battery consumption since the transmitter output power may be much less than the maximum power most of the time.

Figure 3:
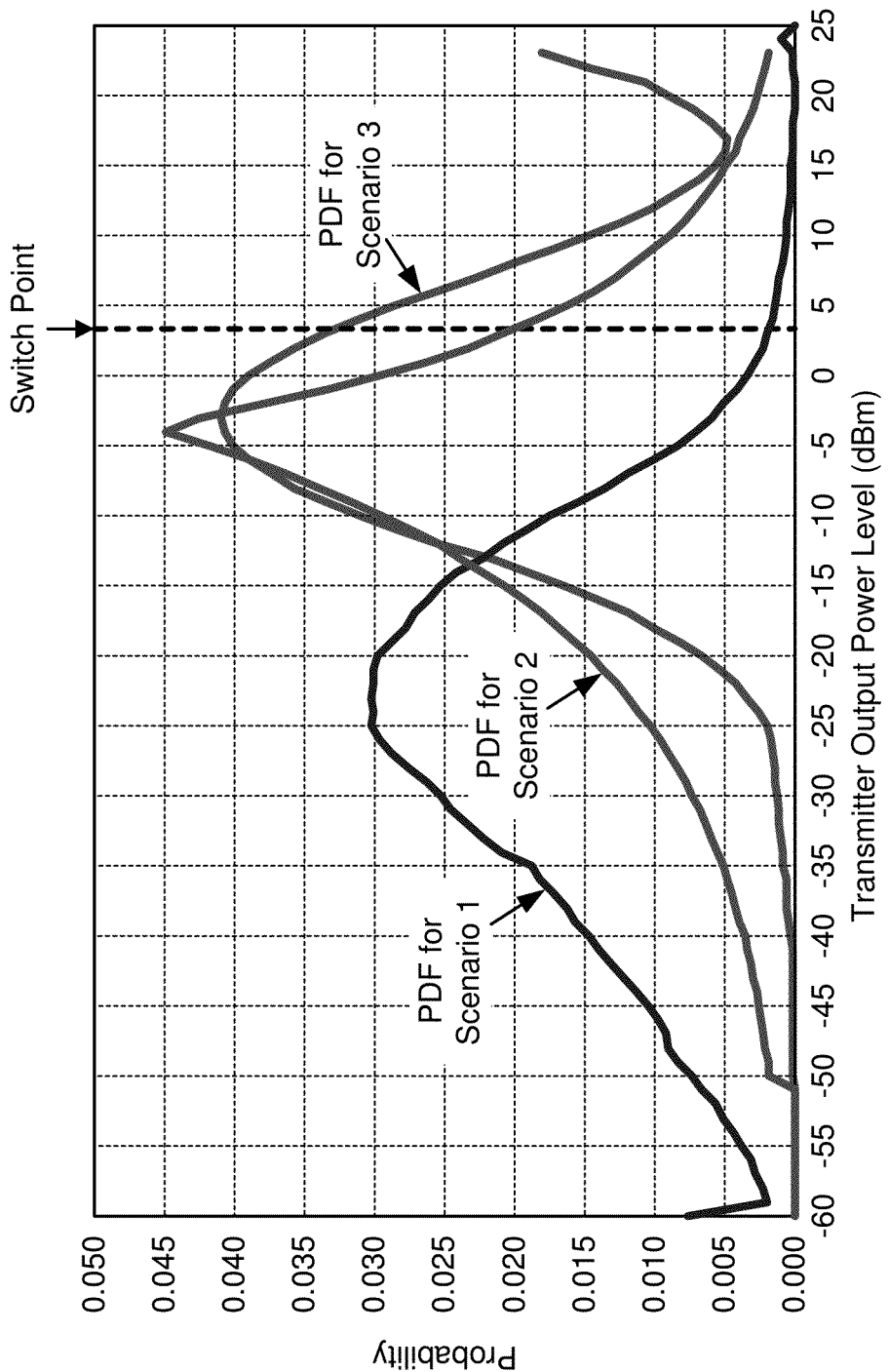
FIG. 3 shows probability density functions of transmitter output power.

FIG. 3 shows three probability density functions (PDFs) of output power of a CDMA signal from transmitter 220 for three network test scenarios. The horizontal axis represents transmitter output power level, which is given in units of dBm. For 1X, the maximum output power is +24 dBm. The vertical axis represents the probability of each transmitter output power level occurring. As shown in FIG. 3, the probability of transmitting at maximum or high output power may be relatively small.

In an aspect, SPS receiver 260 may be biased with different amounts of current for different transmitter output power levels in order to achieve the desired linearity with low power consumption. In general, any number of modes may be supported for SPS receiver 260. Each mode may be associated with (i) a different bias current setting for the circuit blocks within SPS receiver 260 and (ii) a range of transmitter output power levels within which the mode will be selected. In one design that is described in detail below, two mode are supported—a high linearity (HL) mode and a low power (LP) mode. The HL mode utilizes more bias current to achieve better linearity for SPS receiver 260 and may be selected when the transmitter output power is high. The LP mode utilizes less bias current in order to reduce power consumption by SPS receiver 260 and may be selected when the transmitter output power is not high.

A switch point or threshold may be used to select either the HL or LP mode for SPS receiver 260. The switch point may affect both the likelihood of selecting the LP mode and the amount of bias current to use for the LP mode. The switch point may be defined to be (i) high enough so that SPS receiver 260 operates in the LP mode as often as possible but (ii) low enough so that the amount of bias current used in the LP mode is sufficiently low. The switch point may be defined to be +3 dBm (as shown in FIG. 3), +5 dbm, +10 dbm, +15 dbm, etc. The switch point may be static and used for all deployments and all frequency bands. Alternatively, the switch point may be dynamically varied for different network deployments, different frequency bands, different environments observed by wireless device 110, etc. For example, a PDF may be generated for the environment observed by wireless device 110 and may be used to select a suitable switch point. The bias currents of the circuit blocks within SPS receiver 260 may be set based on the switch point.

A state machine may receive information regarding the current status of SPS receiver 260 (e.g., on or off), the current status of transmitter 220, and the current transmitter output power level. The transmitter output power level may be determined based on (i) a control unit that sets the gain of transmitter 220 and which may be implemented by processor 210 or 290 in FIG. 2, (ii) a power detector that measures the transmitter output power (not shown in FIG. 2), and/or (iii) some other unit. For example, the transmitter output power level may be determined based on the gains of DVGA 212 and VGA 226 and the gain/range/state of PA 232.

The state machine may receive information on transmitter output power level in various manners. In one design, the state machine receives an interrupt whenever the transmitter output power level crosses the switch point and updates its state accordingly. The interrupt may be generated, e.g., by DSP 213 within processor 210, by processor 290, etc. In another design, the state machine receives the current transmitter output power level (e.g., by periodically polling DSP 213), determines whether the transmitter output power level has crossed the switch point, and updates its state accordingly.

In general, it may be desirable to know quickly when the transmitter output power level has exceeded the switch point, so that the HL mode can be selected quickly to mitigate degradation due to high transmitter output power. The transition from the HL mode to the LP mode may not be time sensitive and may be achieved, e.g., by periodically polling the transmitter output power.

Figure 4:
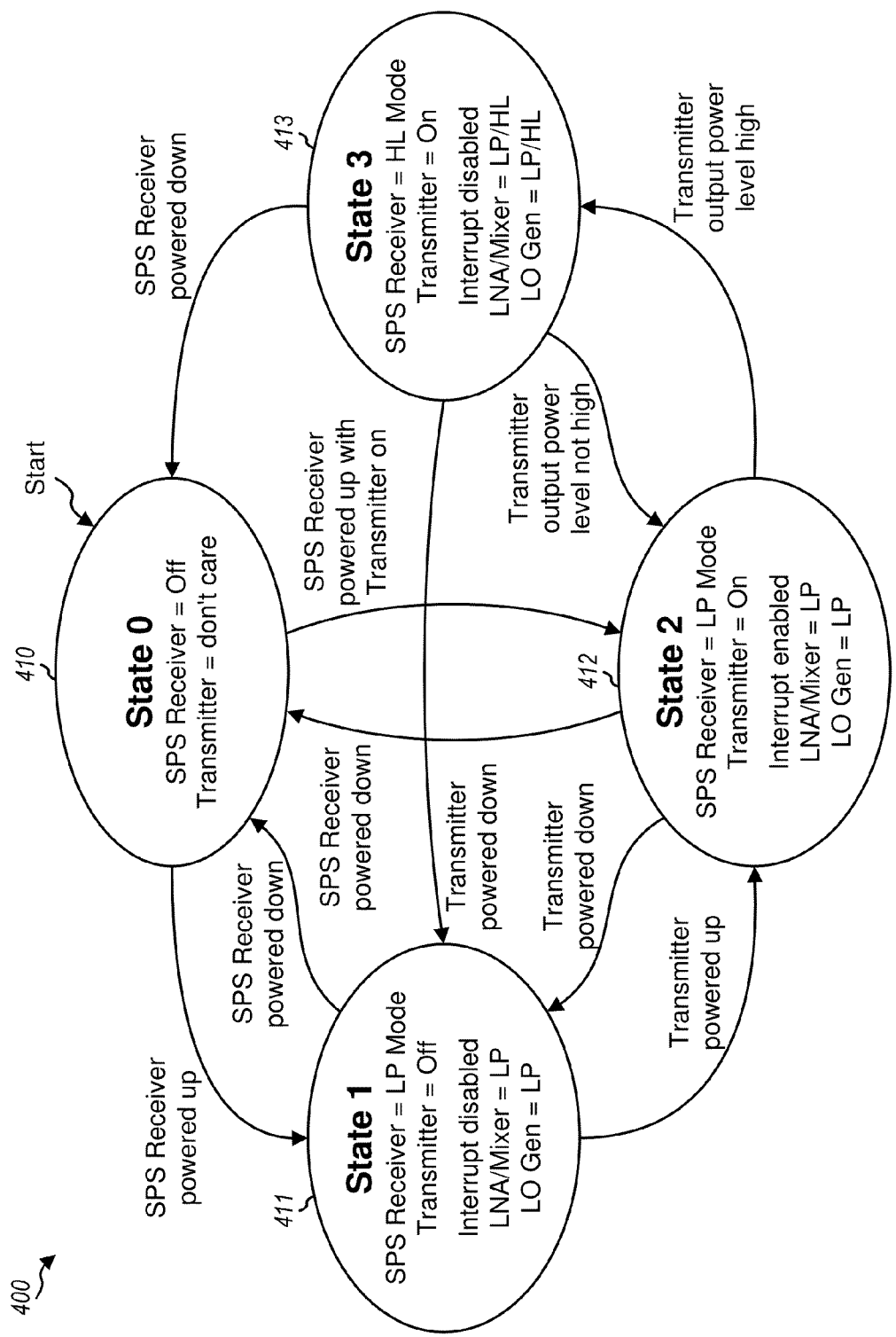
FIG. 4 shows a state diagram for an SPS receiver within the wireless device.

FIG. 4 shows a diagram of a design of a state machine 400 for SPS receiver 260. In the design shown in FIG. 4, state machine 400 includes four states 410, 411, 412 and 413, which are also denoted as states 0, 1, 2 and 3, respectively. States 0, 1, 2 and 3 are defined as follows:

State 0—SPS receiver 260 is off,
State 1—transmitter 220 is off, and SPS receiver 260 is in the LP mode,
State 2—transmitter 220 is on, and SPS receiver 260 is in the LP mode, and
State 3—transmitter 220 is on, and SPS receiver 260 is in the HL mode.

State machine 400 may start in state 0 and, when SPS receiver 260 is powered up, transition to either state 1 if transmitter 220 is off or state 2 if transmitter 220 is on. State machine 400 may transition from state 1 to state 2 when transmitter 220 is powered up. State machine 400 may transition from state 2 to state 3 upon receiving an interrupt due to the transmitter output power level exceeding the switch point and may transition from state 3 back to state 2 when the transmitter output power level falls below the switch point. State machine 400 may transition from either state 2 or 3 back to state 1 when transmitter 220 is powered down, and may transmission from state 1, 2 or 3 back to state 0 when SPS receiver 260 is powered down.

FIG. 4 shows one design of a state machine for SPS receiver 260. In general, a state machine with any number of states and any trigger for transitions between states may be used for SPS receiver 260.

In the design shown in FIG. 4, LNA 264 and mixer 266 (LNA/Mixer) may be switched between the HL and LP modes, and LO generator 286 (LO Gen) may also be switched between the HL and LP modes. In general, any circuit block within SPS receiver 260 may be switched between the HL and LP modes. A given circuit block may also operate in the LP mode all the time regardless of the transmitter output power.

Whether a given circuit block is switched between the HL and LP modes may be dependent on the frequency band of transmitter 220 and/or other factors. The switch point may also be dependent on the frequency band. A look-up table may store, for each frequency band, the switch point for that frequency band and a list of circuit blocks in SPS receiver 260 that should be switched between the HL and LP modes for that frequency band.

Initialization may be performed when transitioning from either state 0 or 1 to state 2. For the initialization, the frequency band for transmitter 220 may be determined, the switch point to use for the frequency band may be ascertained, and the list of circuit blocks to switch between the HL and LP modes may be identified and provided to bias control unit 278. The generation of interrupt may be enabled so that an interrupt is generated whenever the transmitter output power exceeds the switch point.

SPS receiver 260 may be switched from the LP mode to the HL mode when transitioning from state 2 to state 3 due to reception of an interrupt indicating high transmitter output power. For the LP-to-HL transition, the interrupt generation may be disabled, SPS processor 214 may be blanked or disabled, SPS receiver 260 may be blanked or disabled (e.g., by turning off LNA 264 and/or other circuit blocks) and then switched to the HL mode, and a timer may be started. Upon expiration of the timer, SPS processor 214 and SPS receiver 260 may be resumed. Blanking refers to shutting off a circuit block or a processing unit. Blanking may be performed in order to prevent strong interference from possibly corrupting current SPS processing, e.g., SPS signal integration. The interference may be due to PLL 284 becoming unlocked when switching to the HL mode. The timer duration may be selected to be sufficiently long to allow PLL 284 to relock. Blanking may be skipped if not needed, so that processing gain is not degraded due to loss of SPS signal resulting from blanking.

While in the HL mode, the transmitter output power may be examined periodically to determine whether a transition back to the LP mode can be made. In one design, time hysteresis is used to avoid continually toggling between the HL and LP modes. For this design, a transition from the HL mode to the LP mode may occur if the transmitter output power is below the switch point for L consecutive intervals or polling instances. L may be set to 3 or some other value. Time hysteresis may also be achieved in other manners. In another design, signal hysteresis is used to avoid continually toggling between the HL and LP modes. For this design, a transition from the LP mode to the HL mode may occur if the transmitter output power level exceeds a high switch point, and a transition from the HL mode back to the LP mode may occur if the transmitter output power level falls below a low switch point. The difference between the high and low switch points is the amount of hysteresis. A combination of time and signal hysteresis may also be used to avoid continually toggling between the HL and LP modes.

For an HL-to-LP transition, SPS processor 214 may be blanked, SPS receiver 260 may be blanked and then switched to the LP mode, and a timer may be started. Upon expiration of the timer, SPS processor 214 and SPS receiver 260 may be resumed, and the interrupt generation may be enabled to allow for fast transition to the HL mode if necessary. The steps for the HL-to-LP transition (except for the enabling of the interrupt generation) may also be performed whenever transmitter 220 is powered down while SPS receiver 260 is in the HL mode.

A change in frequency band for transmitter 220 may occur while SPS receiver 260 is active. In this case, transmitter 220 may be temporarily disabled for the band change, which may then result in a transition to state 1 in FIG. 4. The initialization described above may be performed when transmitter 220 is enabled on the new frequency band. The switch point and the HL/LP circuit configuration may be updated for the new frequency band by the initialization.

Transmitter 220 may be enabled but may actively transmit for only a portion of the time. For example, IS-95 supports puncturing of some bits when sending data at a rate that is lower than the maximum rate. Transmitter 220 may be blanked (e.g., applied with zero signal value) for the punctured bits. In W-CDMA, wireless device 110 may operate in a compressed mode in which transmitter 220 does not transmit during known transmission gaps in order for receiver 240 to make measurements. In GSM, transmitter 220 may be active in some time slots, and receiver 240 may be active in some other time slots in a TDM manner. In any case, when transmitter 220 is not continuously transmitting, the transmitter output power may be determined as if transmitter 220 is continuously active. This may be achieved by examining the transmitter output power when transmitter 220 is actively transmitting and ignoring time intervals when transmitter 220 is not actively transmitting. This may avoid switching SPS receiver 260 to the LP mode simply because the transmitter output power is examined at time instants in which transmitter 220 is momentarily not active.

The transmitter output power may be determined based on a transmitter gain control word (TX_Gain) and a range for PA 232 (PA_R). The TX_Gain may comprise the gains of all variable gain circuit blocks in transmitter 220, e.g., the gains of DVGA 212 and VGA 226. PA 232 may operate in one of multiple PA ranges. Each PA range may be associated with a specific gain for PA 232 and may be used for a specific range of transmitter output power levels. The mapping between transmitter output power level and the combination of TX_Gain and PA_R may be determined during calibration and stored in a look-up table. The mapping may be dependent on frequency band, channel, temperature, etc. One mapping may be stored in the look-up table for each operating scenario of interest, e.g., for each frequency band supported by transmitter 220.

Figure 5:
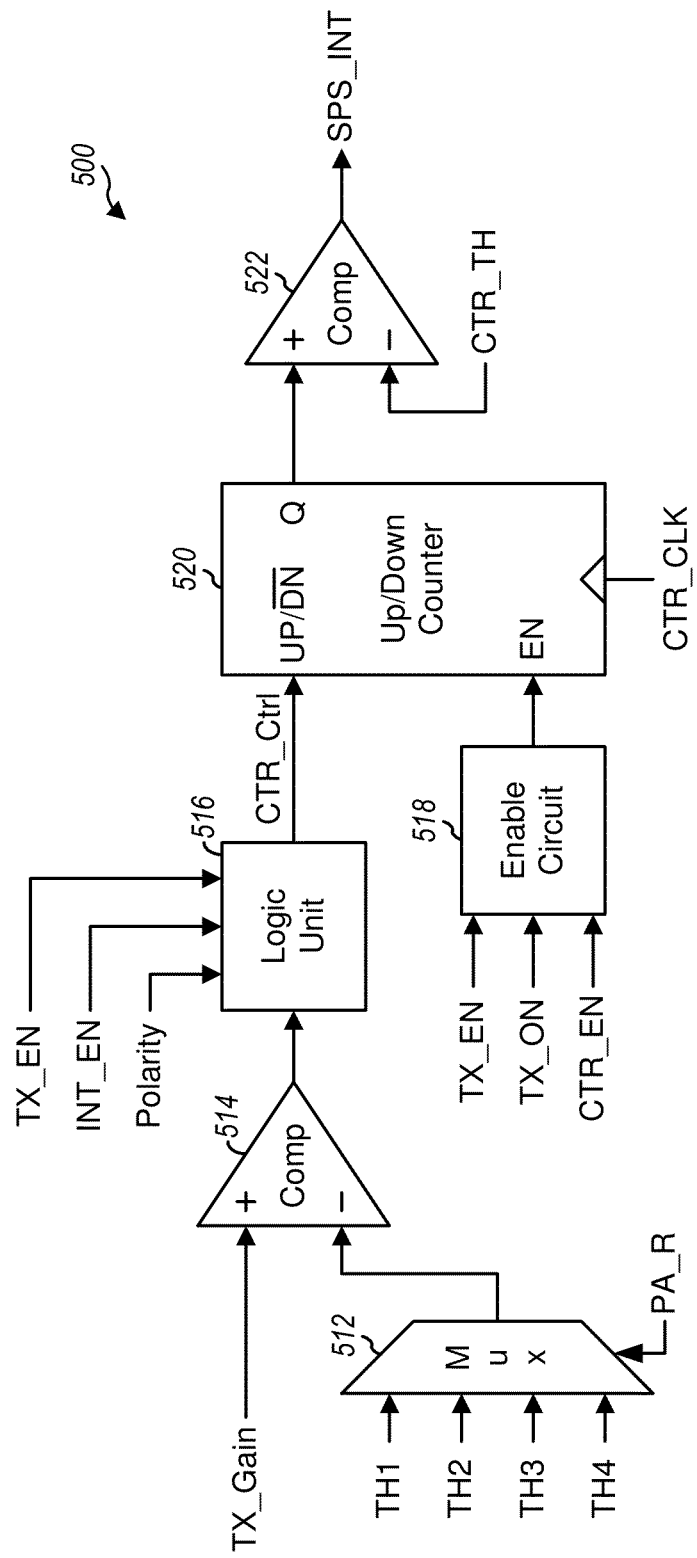
FIG. 5 shows a schematic diagram of an interrupt generation circuit.

FIG. 5 shows a schematic diagram of an interrupt generation circuit 500, which may be implemented within data processor 210 or bias control unit 278 in FIG. 2. Circuit 500 may be used to generate an interrupt whenever the transmitter output power level exceeds the switch point, which may trigger a transition from the LP mode to the HL mode. Circuit 500 may also be used to generate an interrupt whenever the transmitter output power level falls below the switch point, which may trigger a transition from the HL mode to the LP mode.

In the design shown in FIG. 5, PA 232 operates in one of four PA ranges. A multiplexer (Mux) 512 receives four thresholds TH1, TH2, TH3 and TH4 for the four PA ranges and provides the threshold corresponding to the current PA range, as indicated by the PA_R control. The four thresholds may be selected such that comparing the TX_Gain for each PA range against the corresponding threshold is equivalent to comparing the transmitter output power level against the switch point. A comparator 514 receives the threshold from multiplexer 512 and the TX_Gain at two inputs, provides a logic high if the TX_Gain exceeds the threshold, and provides a logic low otherwise.

A logic unit 516 receives the output of comparator 514, a TX_EN signal, an INT_EN signal, and a Polarity signal. The TX_EN signal is at logic high when transmitter 220 is enabled and at logic low otherwise. When transmitter 220 is enabled, the circuit blocks within transmitter 220 are powered up, and transmitter 220 is ready for transmission. The INT_EN signal is at logic high to enable circuit 500 and at logic low otherwise. The Polarity signal indicates whether to generate an interrupt if the TX_Gain is above the threshold (e.g., if SPS receiver 260 is currently in the LP mode) or below the threshold (e.g., if SPS receiver 260 is currently in the HL mode). Unit 516 generates a CTR_Ctrl signal based on the input signals and provides the CTR_Ctrl signal to an UP/$\overline{DN}$ input of an up/down counter 520. The CTR_Ctrl signal may be set equal to the output of comparator 514 (after any inversion by the Polarity signal) when the TX_EN signal is at logic high. The TX_EN signal may be used to generate an interrupt if transmitter 220 is turned off and SPS receiver 260 is in the HL mode, so that an HL-to-LP transition can take place.

An enable unit 518 receives the TX_EN signal, a TX_ON signal, and a CTR_EN signal and provides an output signal to an enable (EN) input of counter 520. The TX_ON signal is at logic high when transmitter 220 is actively transmitting and at logic low otherwise. The CTR_EN signal is at logic high to enable counter 520 and at logic low otherwise. Unit 518 enables counter 520 when the CTR_EN signal is at logic high. Unit 518 disables counter 520 when the TX_ON signal is at logic low and the TX_EN signal is at logic high, so that counter 520 is not updated when transmitter 220 is momentarily inactive, e.g., during punctured periods or transmission gaps.

Counter 520 increments up or down based on the CTR_Ctrl signal from unit 516 and when enabled by the output of unit 518. A comparator 522 receives the output of counter 520 and a counter threshold CTR_TH at two inputs and provides an interrupt SPS_INT if the counter output exceeds the counter threshold.

FIG. 5 shows one design of an interrupt generation circuit. Other designs may also be used to generate triggers for transitioning between the HL and LP modes.

Transitions between the LP and HL modes may introduce jumps or discontinuities in gain, phase, and/or group delay of the SPS baseband signal from driver 276 in SPS receiver 260. The gain jump may be handled by an automatic gain control (AGC) loop maintained for SPS. The phase jump may be characterized a priori and corrected with a digital rotator within data processor 210 in order to compensate for phase discontinuities. The group delay jump may be accounted for by a programmable delay unit within data processor. Performance degradation due to jumps in gain, phase, and/or group delay may be reduced by limiting the rate of transitions between the LP and HL modes.

Referring back to FIG. 2, the bias currents of various circuit blocks within SPS receiver 260 may be varied based on the mode of the SPS receiver. Each circuit block with variable bias current may be implemented with various designs. Example designs for LNA 264, mixer 266, and LO generator 286 are described below.

Figure 6:
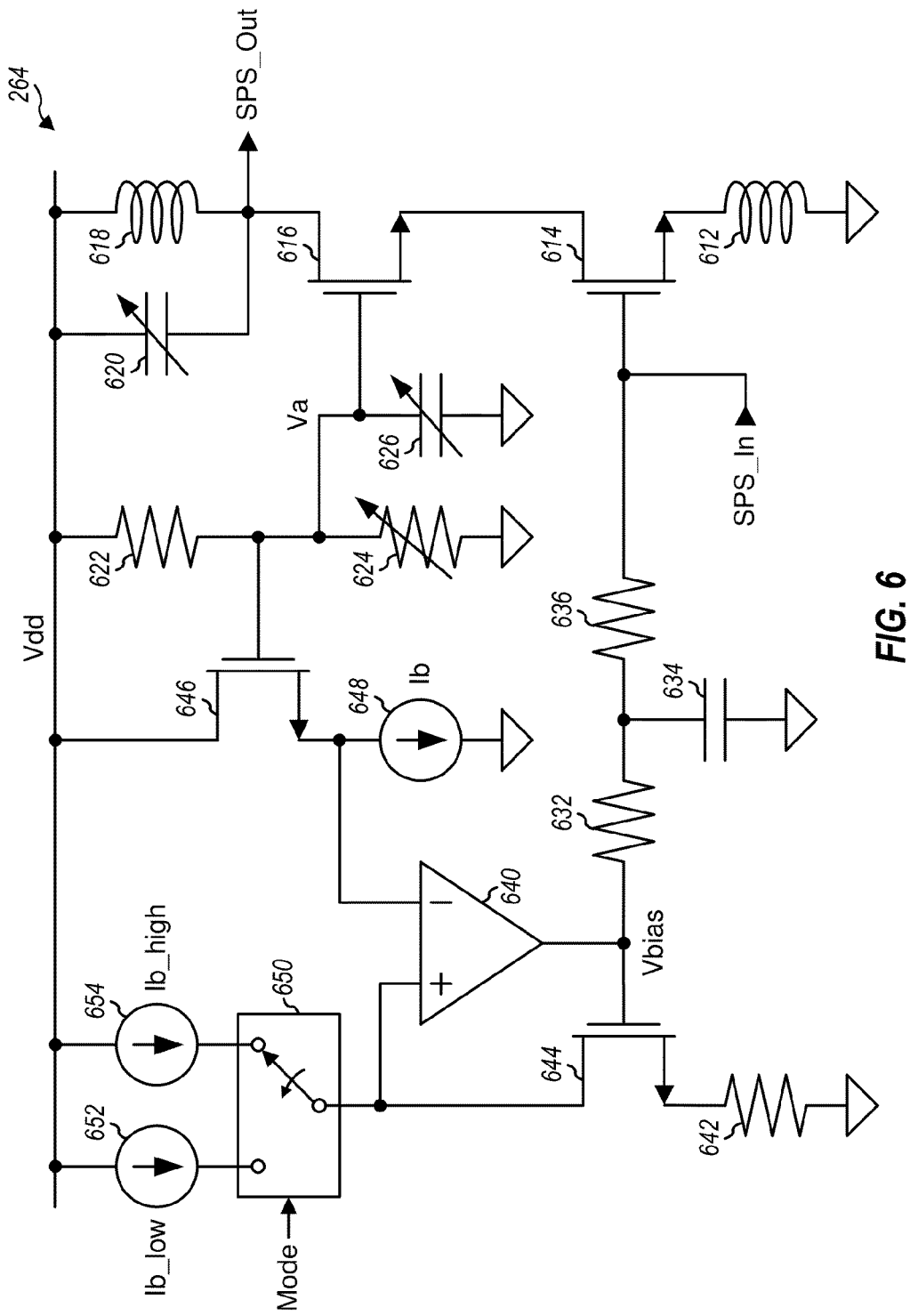
FIG. 6 shows a schematic diagram of an LNA within the SPS receiver.

FIG. 6 shows a schematic diagram of a design of LNA 264 within SPS receiver 260 in FIG. 2. In this design, LNA 264 is implemented with a cascode common source with inductive degeneration topology. This topology may provide gain to mitigate noise of subsequent stages and may also introduce little additional noise, even with the circuitry used to dynamically adjust the linearity of the LNA.

Within LNA 264, N-channel field effect transistors (N-FETs) 614 and 616 are coupled in a cascode configuration. N-FET 614 has its gate receiving an SPS_In signal, its source coupled to one end of an inductor 612, and its drain coupled to the source of N-FET 616. The other end of inductor 612 is coupled to circuit ground. N-FET 616 has its gate receiving a Va voltage and its drain providing an SPS_Out signal. An inductor 618 and a capacitor 620 are coupled in parallel and between the drain of N-FET 616 and a supply voltage, Vdd. Resistors 622 and 624 form a voltage divider network, are coupled between the supply voltage and circuit ground, and provide the Va voltage. A capacitor 626 is coupled between the gate of N-FET 616 and circuit ground.

An N-FET 644 has its source coupled to one end of a resistor 642, its gate coupled to an output of an operational amplifier (out amp) 640, and its drain coupled to one end of a switch 650. The other end of resistor 642 is coupled to circuit ground. Switch 650 couples a bias current source 652 to the drain of N-FET 644 in the LP mode and couples a bias current source 654 to the drain of N-FET 644 in the HL mode. Bias current source 652 provides a bias current of Ib_low for the LP mode, and bias current source 652 provides a bias current of Ib_high for the HL mode.

An N-FET 646 has its gate receiving the Va voltage, its source coupled to one end of a current source 648, and its drain coupled to the supply voltage. The other end of current source 648 is coupled to circuit ground. Op amp 640 has its non-inverting input coupled to the drain of N-FET 644 and its inverting input coupled to the source of N-FET 646. Op amp 640 provides a bias voltage, Vbias, for N-FETs 614 and 644. Resistors 632 and 636 are coupled in series and between the gates of N-FETs 644 and 614. A capacitor 634 is coupled between resistors 632 and 636 and circuit ground.

Inductor 612 provides source degeneration for N-FET 614. Inductor 618 and capacitor 620 form a tuned load that may be tuned to a desired frequency band, which is 1.57542 GHz for GPS. Resistor 632 and capacitor 634 form a lowpass filter for the Vbias voltage from op amp 640. Resistor 636 provides isolation between the SPS_In signal and the Vbias voltage.

N-FET 644 forms a current minor for N-FET 614, with the bias current of N-FET 614 minoring the bias current of N-FET 644. Resistor 642 models the resistive loss of inductor 612 and allows for better matching of the gate-to-source voltages, $V_{gs}$, for N-FETs 614 and 644. N-FET 646 minors N-FET 616, with the source voltage of N-FET 646 closely matching the source voltage of N-FET 616, which is also the drain voltage of N-FET 614. N-FET 646 thus provides access to the drain of N-FET 614, which is a sensitive node. Op amp 640 varies the Vbias voltage applied to the gates of N-FETs 614 and 644 such that the gate-to-drain voltage, $V_{gd}$, of N-FET 614 closely matches the $V_{gd}$ of N-FET 644. Op amp 640 thus ensures that the operating point of N-FET 614 closely matches the operating point of N-FET 644. This feedback loop with op amp 640 allows for accurate control of the bias current of N-FET 614 using only a small amount of bias current for N-FET 644. For example, if the desired bias current for N-FET 614 is Ibias, then N-FET 644 may be biased with Ibias/X, where X may be a factor of 10 or more.

The cascode configuration in FIG. 6 may provide certain advantages such as better isolation from the LNA input to the LNA output, higher LNA gain, higher output impedance, etc. The feedback loop with op amp 640 may provide certain advantages such as better matching of the operating points (e.g., $V_{gd}$) of N-FETs 614 and 644, which may allow for use of a larger current ratio between N-FETs 614 and 644.

Figure 7:
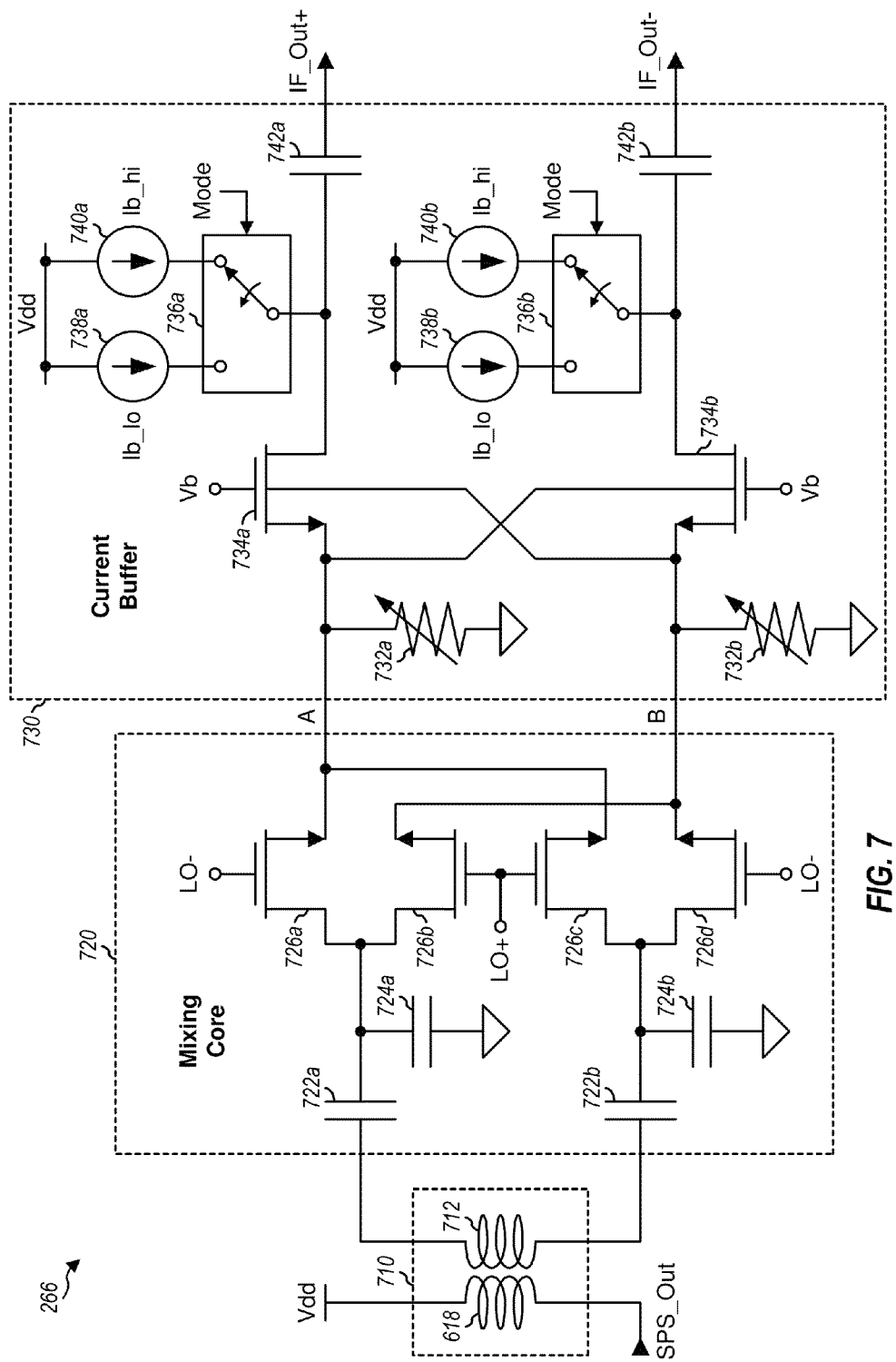
FIG. 7 shows a schematic diagram of a mixer within the SPS receiver.

FIG. 7 shows a schematic diagram of a design of mixer 266 within SPS receiver 260 in FIG. 2. In this design, mixer 266 includes a mixing core 720 and a current buffer 730. Mixer 266 is implemented with a passive mixer with current buffer topology, which may improve noise performance and provide bias current programmability based on linearity requirements.

A transformer 710 couples the SPS_Out signal from LNA 264 to the input of mixer 266. Transformer 710 is composed of primary inductor 618 magnetically coupled to a secondary inductor 712. Inductor 618 is part of LNA 264 in FIG. 6. The differential voltage across inductor 712 is the mixer input signal. Transformer 710 performs single-ended to differential conversion and may further provide signal current gain depending on the ratio of the number of turns in secondary inductor 712 to the number of turns in primary inductor 618.

Within mixing core 720, a capacitor 722a is coupled between one end of inductor 712 and the drains of N-FETs 726a and 726b. A capacitor 724a is coupled between the drains of N-FETs 726a and 726b and circuit ground. Similarly, a capacitor 722b is coupled between the other end of inductor 712 and the drains of N-FETs 726c and 726d. A capacitor 724b is coupled between the drains of N-FETs 726c and 726d and circuit ground. The sources of N-FETs 726a and 726c are coupled together and to node A of mixer 266. The sources of N-FETs 726b and 726d are coupled together and to node B of mixer 266. The gates of N-FETs 726a and 726d receive an inverting LO signal, LO−. The gates of N-FETs 726b and 726c receive a non-inverting LO signal, LO+.

Within current buffer 730, a resistor 732a is coupled between node A and circuit ground. An N-FET 734a has its source coupled to node A, its gates receiving a Vb voltage, and its drain coupled to one end of a capacitor 742a. A switch 736a couples a bias current source 738a to the drain of N-FET 734a in the LP mode and couples a bias current source 740a to the drain of N-FET 734a in the HL mode. Similarly, a resistor 732b is coupled between node B and circuit ground. An N-FET 734b has its source coupled to node B, its gates receiving the Vb voltage, and its drain coupled to one end of a capacitor 742b. A switch 736b couples a bias current source 738b to the drain of N-FET 734b in the LP mode and couples a bias current source 740b to the drain of N-FET 734b in the HL mode. Bias current sources 738a and 738b provide a bias current of Ib_lo for the LP mode, and bias current sources 740a and 740b provide a bias current of Ib_hi for the HL mode. The other ends of capacitors 742a and 742b provide a differential IF signal to amplifier 268.

Mixing core 720 implements a passive mixer that consumes no DC power, as shown by no DC paths for the drains of N-FETs 726a through 726d. A passive mixer may provide better linearity and may generate less noise than an active mixer. Capacitors 722a and 722b are AC coupling capacitors. Capacitors 724a and 724b are used to model the parasitic capacitance of switching devices N-FET 726a through 726d. N-FETs 726a through 726d mix the RF signal from transformer 710 with the differential LO signal and provide the differential IF signal.

Current buffer 730 is implemented with a common gate current buffer topology. Resistors 732a and 732b, selected bias current sources 738 or 740, and voltage Vb at the gates of N-FETs 734a and 734b set the biasing point for current buffer 730. N-FETs 734a and 734b buffer the differential current signal from mixing core 720 and isolate amplifier 268 from the mixing core. Capacitors 742a and 742b are AC coupling capacitors.

FIG. 8 shows a schematic diagram of a design of LO generator 286 for SPS receiver 260 in FIG. 2. Within LO generator 286, a switch 812 receives a voltage controlled oscillator (VCO) signal from PLL 282, passes the VCO signal to a high linearity divider/buffer 814 when the HL mode is selected, and passes the VCO signal to a low power divider/buffer 816 when the LP mode is selected. Either divider/buffer 814 or 816 may be powered on at any given moment depending on the mode of SPS receiver 260. A switch 818 provides the output of divider/buffer 814 as the LO signal for mixer 266 when the HL mode is selected and provides the output of divider/buffer 816 when the LP mode is selected.

FIGS. 6, 7 and 8 show example designs of LNA 264, mixer 266, and LO generator 286 for two modes. Other designs may also be used for these circuit blocks. Furthermore, more than two modes may be supported by each circuit block.

FIG. 9 shows a design of a process 900 for operating an SPS receiver, e.g., a GPS receiver. Process 900 may be performed by processor 210, controller 216, processor 290, unit 278, etc., in FIG. 2. An output power level of a transmitter that is co-located with the SPS receiver may be determined (block 912). The transmitter may be a CDMA transmitter or some other type of transmitter. The transmitter and the SPS receiver may be co-located if they are implemented on the same integrated circuit (IC), the same circuit board, the same wireless device, etc. The transmitter output power level may be determined based on the range of a PA within the transmitter and a gain of the transmitter, as described above, or in some other manner.

Bias current of the SPS receiver may be adjusted based on the output power level of the transmitter (block 914). The SPS receiver may comprise at least one circuit block with adjustable bias current, e.g., a LNA, a mixer, an LO generator, etc. The bias current of each circuit block may be adjusted based on the transmitter output power level.

A state machine comprising a plurality of states may be maintained. For example, the state machine may comprise the states shown in FIG. 4. Each state may be associated with a particular mode for the SPS receiver and a particular mode for the transmitter. The bias current of the SPS receiver may be selected based on the current state in the state machine.

The SPS receiver may be operated in one of a plurality of modes, which may be associated with different bias current settings for the SPS receiver. One of the modes may be selected based on the transmitter output power level and at least one switch point. The bias current of the SPS receiver may be set based on the selected mode.

FIG. 10 shows a design of block 914. In this design, the transmitter output power level may be compared against a switch point (block 1012). A first mode (e.g., a low power mode) may be selected for the SPS receiver if the transmitter output power level is below the switch point (block 1014). A second mode (e.g., a high linearity mode) may be selected for the SPS receiver if the transmitter output power level is above the switch point (block 1016). The second mode is associated with more bias current for the SPS receiver than the first mode.

An interrupt may be received when the transmitter output power level exceeds the switch point. The second mode for the SPS receiver may be selected in response to receiving the interrupt. While the SPS receiver is in the second mode, polling may be performed to determine whether the transmitter output power level is below the switch point. The first mode may be selected when the polling indicates that the transmitter output power level is below the switch point. Whether the transmitter output power is above or below the switch point may also be determined in other manners. Time hysteresis and/or signal hysteresis may be used for transitions between the first and second modes.

The techniques described herein may be implemented by various means. For example, these techniques may be implemented in hardware, firmware, software, or a combination thereof. For a hardware implementation, the processing units used to determine the operating mode of an SPS receiver and to adjust bias current of the SPS receiver may be implemented within one or more ASICs, DSPs, digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

For a firmware and/or software implementation, the techniques may be implemented with modules (e.g., procedures, functions, etc.) that perform the functions described herein. The firmware and/or software instructions may be stored in a memory (e.g., memory 292 in FIG. 2) and executed by a processor (e.g., processor 290). The memory may be implemented within the processor or external to the processor. The firmware and/or software instructions may also be stored in other processor-readable medium such as random access memory (RAM), read-only memory (ROM), non-volatile random access memory (NVRAM), programmable read-only memory (PROM), electrically erasable PROM (EEPROM), FLASH memory, compact disc (CD), magnetic or optical data storage device, etc.

The circuit blocks described herein (e.g., LNA 264 in FIG. 6, mixer 266 in FIG. 7, LO generator 286 in FIG. 8, etc.) may be implemented with various types of transistors such as N-FETs, P-FETs, metal oxide semiconductor FETs (MOSFETs), bipolar junction transistors (BJTs), gallium arsenide (GaAs) FETs, etc. These circuit blocks may also be fabricated in various IC processes and in various types of IC such as RF ICs (RFICs), mixed-signal ICs, etc.

An apparatus implementing the techniques or circuit blocks described herein may be a stand-alone unit or may be part of a device. The device may be (i) a stand-alone IC, (ii) a set of one or more ICs that may include memory ICs for storing data and/or instructions, (iii) an ASIC such as an MSM, (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A device including a low noise amplifier (LNA) for amplifying an input signal, the LNA comprising:
   a first transistor configured to receive the input signal,
   a second transistor configured to receive a bias current and forming a current mirror for the first transistor, and
   an operational amplifier (op amp) operative to generate a bias voltage for the first transistor and for the second transistor to match operating points of the first and second transistors, wherein the op amp is configured to receive a first voltage and a second voltage at inverting and non-inverting inputs, respectively, and to generate the bias voltage based on the first voltage and the second voltage, the first voltage being a replicated output voltage of the first transistor, and the second voltage being an output voltage of the second transistor.

2. The device of claim 1, wherein the LNA further comprises:
   a third transistor coupled to the first transistor in a cascode configuration and configured to provide an output signal for the LNA.

3. The device of claim 2, wherein the LNA further comprises:
   a fourth transistor configured to provide the replicated output voltage of the first transistor, the third and four transistors having gates coupled together.

4. The device of claim 1, wherein the LNA further comprises:
   a source degeneration inductor coupled to a source of the first transistor, and
   a source degeneration resistor coupled to a source of the second transistor, the source degeneration resistor modeling resistive loss of the source degeneration inductor.

5. The device of claim 1, wherein a bias current of the first transistor is multiple times the bias current received by the second transistor.

6. The device of claim 1, wherein a bias current of the first transistor is at least ten times the bias current received by the second transistor.

7. The device of claim 1, wherein the LNA further comprises:
   a low-pass filter configured to receive the bias voltage from the op amp and provide a filtered bias voltage to the first transistor.

8. The device of claim 1, further comprising:
   at least one bias current source configured to provide adjustable bias current for the second transistor.

9. An integrated circuit including a low noise amplifier (LNA) for amplifying an input signal, the LNA comprising:
   a first transistor configured to receive the input signal;
   a second transistor configured to receive a bias current and forming a current mirror for the first transistor; and
   an operational amplifier (op amp) operative to generate a bias voltage for the first transistor and for the second transistor to match operating points of the first and second transistors, wherein the op amp is configured to receive a first voltage and a second voltage at inverting and non-inverting inputs, respectively, and to generate the bias voltage based on the first voltage and the second voltage, the first voltage being a replicated output voltage of the first transistor, and the second voltage being an output voltage of the second transistor.

10. The integrated circuit of claim 9, wherein the LNA further comprises:
    a third transistor coupled to the first transistor in a cascode configuration and configured to provide an output signal for the LNA; and
    a fourth transistor configured to provide the replicated output voltage of the first transistor, the third and four transistors having gates coupled together.

\* \* \* \* \*